United States Patent
Yamazaki et al.

(10) Patent No.: US 6,461,943 B1
(45) Date of Patent: *Oct. 8, 2002

(54) METHOD OF MAKING SEMICONDUCTOR DEVICE

(75) Inventors: Shunpei Yamazaki, Tokyo; Hideto Ohnuma, Kanagawa; Tamae Takano, Kanagawa; Hisashi Ohtani, Kanagawa, all of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/707,348

(22) Filed: Nov. 6, 2000

Related U.S. Application Data

(63) Continuation of application No. 09/010,416, filed on Jan. 21, 1998, now Pat. No. 6,162,704.

(30) Foreign Application Priority Data

Feb. 12, 1997 (JP) .............................................. 9-044573

(51) Int. Cl.$^7$ ............................................. H01L 21/322
(52) U.S. Cl. ........................ 438/471; 438/143; 438/151; 438/162; 438/164; 438/166; 438/473
(58) Field of Search .................................. 438/166, 162, 438/149, 151, 164, 143, 471, 473

(56) References Cited

U.S. PATENT DOCUMENTS

| | | | | |
|---|---|---|---|---|
| 5,591,653 A | * | 1/1997 | Sameshima et al. | 438/166 |
| 5,605,846 A | * | 2/1997 | Ohtani et al. | 438/166 |
| 5,637,515 A | * | 6/1997 | Takemura | 438/166 |
| 5,639,698 A | | 6/1997 | Yamazaki et al. | |
| 5,700,333 A | | 12/1997 | Yamazaki et al. | |
| 5,854,096 A | * | 12/1998 | Ohtani et al. | 438/166 |
| 5,915,174 A | * | 6/1999 | Yamazaki et al. | 438/487 |
| 6,162,704 A | * | 12/2000 | Yamazaki et al. | 438/471 |

* cited by examiner

Primary Examiner—Trung Dang
(74) Attorney, Agent, or Firm—Fish & Richardson P.C.

(57) ABSTRACT

To provide a method of removing a catalyst element from a crystalline silicon film obtained by solid phase growth using the catalyst element promoting crystallization, phosphorus is implanted selectively to the crystalline silicon film having the catalyst element whereby a portion of the silicon film implanted with phosphorus is made amorphous, and when a thermal annealing treatment is performed and the silicon film is heated, the catalyst element is moved to an amorphous portion implanted with phosphorus having large gettering capacity by which the concentration of the catalyst element in the silicon film is lowered and a semiconductor device is fabricated by using the silicon film.

52 Claims, 12 Drawing Sheets

NICKEL REMOVING DIRECTION

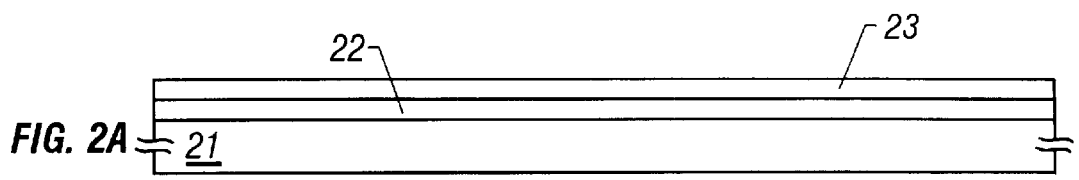
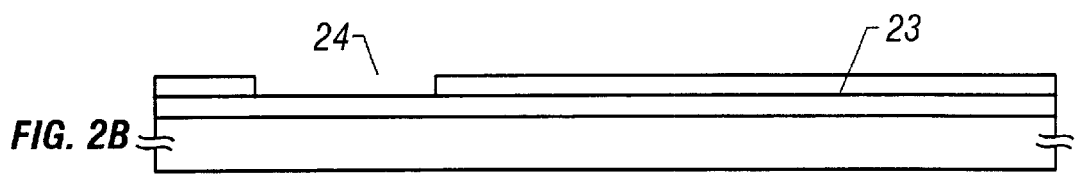
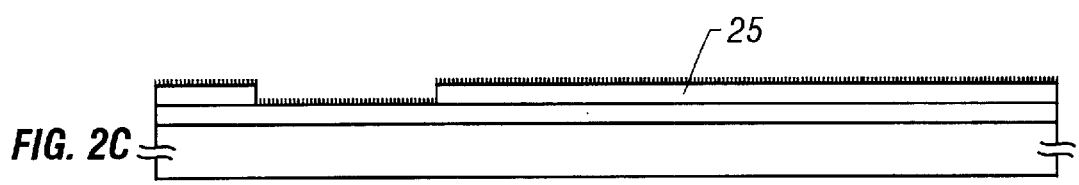
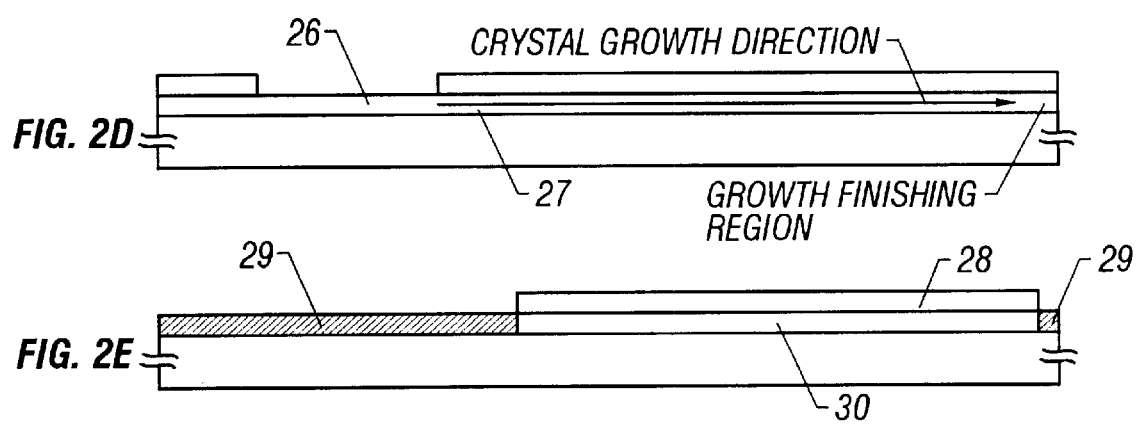
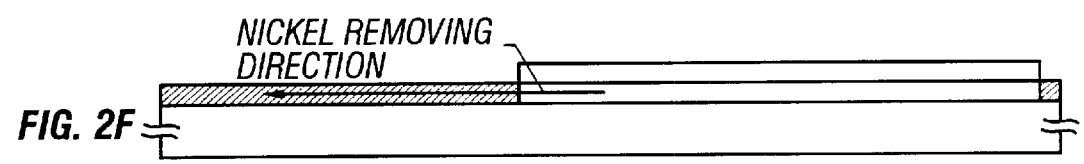
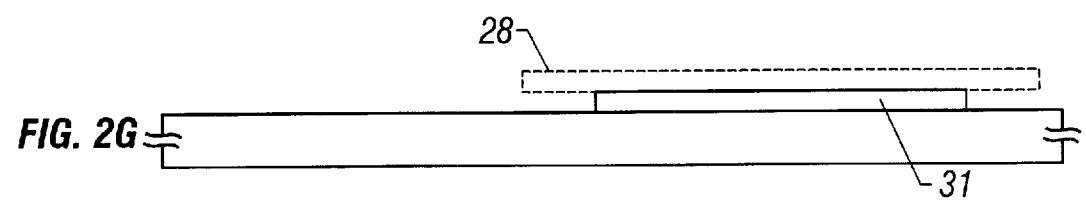

METHOD OF MAKING SEMICONDUCTOR DEVICE

This application is a continuation of U.S. application Ser. No. 09/010,416, filed Jan. 21, 1998 now U.S. Pat. No. 6,162,704, which claims the foreign priority from JP-9-044573, filed Feb. 12, 1997.

BACKGROUND OF THE INVENTION

1. Field of the Invention

The present invention relates to a method of making a silicon semiconductor film having crystalline performance, for example, a polycrystal silicon film, a single crystal silicon film or a microcrystal silicon film. A crystalline silicon film fabricated by using the present invention is used in various semiconductor devices.

2. Description of the Related Art

There has been known a thin film transistor (hereinafter, referred to as TFT or the like) using a thin film semiconductor. TFT is constituted by forming a thin film semiconductor, particularly a silicon semiconductor film on a substrate and by using the thin film semiconductor. Although TFT is utilized in various integrated circuits, TFT attracts attention particularly as a switching element provided to each pixel of an active matrix type liquid crystal display device and a driver element formed at a peripheral circuit portion thereof. Further, TFT attracts attention as a technology indispensable also in a multiple structure integrated circuit (three-dimensional IC).

Although it is convenient to use an amorphous silicon film for a silicon film utilized in TFT, electric properties thereof are far lower than those of a single crystal semiconductor film used in a semiconductor integrated circuit. Accordingly, TFT has been used only in a limited usage such as a switching element of an active matrix circuit. A silicon thin film having crystalline performance may be utilized for promoting the properties of TFT.

A silicon film having crystalline performance is referred to as a polycrystal silicon film, a polysilicon film, a microcrystal silicon film or the like other than a single crystal silicon film. To provide such a silicon film having crystalline performance, an amorphous silicon film is firstly formed and thereafter, the film is crystallized by heating (thermally annealing) the film. The process is referred to as solid phase growth process since an amorphous state is transformed into a crystalline state while maintaining a solid state.

However, in the solid state growth of silicon, a heating temperature of 600° C. or higher and a time period of 10 hours or more are needed and an inexpensive glass substrate is difficult to use as a substrate. For example, Corning 7059 glass used in an active type liquid crystal display device is provided with the strain point of glass of 593° C. which is problematic in performing thermal annealing at 600° C. or higher when large area formation of the substrate is considered.

According to a research conducted by the inventors on such a problem, it has been found that when a certain kind of metal element of nickel or the like is piled up on the surface of an amorphous silicon film by a small amount and thereafter the film is heated, the crystallization can be performed at 550° C. for a processing time period of about 4 hours. Naturally, a silicon film having a further excellent crystalline performance can be provided by performing the annealing process at 600° C. for 4 hours. (refer to Japanese Unexamined Patent Publication No. JP-A-6-244103).

In order to introduce such a small amount of metal element, there are a method of piling up a film of a catalyst element or a compound thereof by a sputtering process (Japanese Unexamined Patent Publication No. JP-A-6-244104), a method of forming a film of a metal element or a compound thereof by means of spin coating (Japanese Unexamined Patent Publication No. JP-A-7-130652), a method of forming a film by decomposing a gas including a metal element by thermal decomposition, plasma decomposition or the like (Japanese Unexamined Patent Publication No. JP-A-7-335548) and the like which may be used according to the respective characteristic.

Further, it is possible to introduce a metal element selectively at a specific portion and to expand crystal growth from a portion where the metal element is introduced to surroundings by heating (lateral growth process or horizontal growth process). Crystal silicon provided by such a method has an orientation of crystallization and therefore, extremely excellent properties are shown in accordance with the orientation.

Further, it is also effective to further improve crystalline performance by irradiating strong beam such as laser beam or the like after a crystallizing step using a metal element (Japanese Unexamined Patent Publication No. JP-A-7-307286). Further, according to the above-described lateral growth process, it is effective to perform thermal oxidation in succession thereto (Japanese Unexamined Patent Publication No. JP-A-7-66425).

When crystallization is performed by using a metal element in this way, a crystalline silicon film having excellent quality is provided at a lower temperature in a shorter period of time. A temperature of heating treatment is preferably falls in a range of 450 through 650° C., particularly preferably, in a range of 550 through 600° C., although strongly dependent on the kind of an amorphous silicon film.

However, the most serious problem in the method is removal of metal element. It cannot be disregarded that a metal element introduced in a silicon film effects adverse influence on the electric properties and reliability. Particularly, in the step of crystallization using a metal element, as the mechanism of step, the metal element remains in the film mainly as a conductive silicide which constitutes a significant factor of defect.

It is generally known that a metal element (particularly, nickel, palladium, platinum, copper, silver or gold) can be removed by a heating treatment in an atmosphere of hydrogen chloride at high temperatures. However, a high temperature treatment at about 1000° C. is needed therefor which is against the thought of low temperature process using a metal element. The present invention has been carried out in view of the above-described problem and it is an object of the present invention to provide a method effective in removing a metal element by providing conditions preferable for gettering.

SUMMARY OF THE INVENTION

According to the invention disclosed in the specification, a region implanted with an element of 15 group (representatively, phosphorus) at high concentration is firstly provided in a silicon film, contiguous to a region intended to remove a metal element initially.

This region is impaired by implantation of the element of 15 group. Further, by performing a heating treatment, a metal element for promoting crystallization is made to move to the region to which the element of 15 group is acceleratingly implanted.

With respect to the region acceleratingly implanted with the element of 15 group:

(1) High density of unpaired bonds are formed by implanting ions.

(2) The element of 15 groups per se is provided with a property of bonding with a metal element (the property is particularly significant in phosphorus).

Accordingly, the movement of a metal element in accordance with a heating treatment to a region implanted with an element of 15 group as described above, is irreversible.

Therefore, by performing a heating treatment, as a result, a state where a metal element for promoting crystallization is moved from a region where the element of 15 group is implanted to a region where the 15 group is not implanted, is provided.

Particularly, when phosphorus is utilized, the above-described operation can significantly be obtained since phosphorus and nickel constitutes a stable bondage state at a temperature around 600° C.

Phosphorus and nickel is provided with a number of bondage states such as $Ni_3P$, $Ni_5P_2$, $Ni_2P$, $Ni_3P_2$, $Ni_2P_3$, $NiP_2$, $NiP_3$.

Therefore, when nickel is adopted as a metal element promoting crystallization and phosphorus is adopted as an element of 15 group, nickel can be drawn as an object of bondage with phosphorus very effectively. That is, gettering can be performed effectively.

Photographs shown by FIGS. 7A and 7B show an effect of gettering. The photograph shown by FIG. 7A indicates a pattern of a silicon film in which gettering is performed to a crystalline silicon film obtained by utilizing nickel in accordance with a first aspect of the present invention.

In the state shown by FIG. 7A, nickel has been absorbed to a region outside of the pattern (region is removed in photograph).

FIG. 7B shows a pattern of a silicon film when gettering of nickel is not performed. Speckles observed in the pattern of the silicon film shown by FIG. 7B are fine openings showing a state where remaining nickel and nickel compounds have been removed. This state is obtained by performing a treatment by using a special etchant (mixture of hydrofluoric acid, hydrogen peroxide and water) capable of removing nickel and nickel compounds with high selectivity.

Although the treatment by using the above-described etchant is performed in respect of the pattern shown by FIG. 7A, the speckles shown by FIG. 7B are not observed since nickel has been removed by a gettering step and the nickel compound is not present in the pattern.

Further, FIG. 11A shows the characteristic of TFT fabricated by using a film in correspondence with FIG. 7A, and FIG. 11B shows the characteristic of TFT fabricated by using a film in correspondence with FIG. 7B. Further, in fabricating TFTs, the treatment of an etchant for removing nickel is not performed.

As is apparent from FIGS. 11A and 11B, when nickel remains in an activation layer, the OFF characteristic is significantly deteriorated. Further, although a representative characteristic is shown in FIGS. 11A and 11B, when the film shown by FIG. 7B is used, a dispersion of the characteristic per se is significantly large.

According to a first aspect of the present invention disclosed in the specification there is provided a method of making a semiconductor device including;

a step of forming a crystalline film by crystallizing an amorphous silicon film or an amorphous film including silicon by using a metal promoting to crystallize silicon, a step of accumulating stress and strain by irradiating a pulse laser beam or an equivalent strong beam to the crystalline film, a step of selectively forming a mask on the crystalline film, a step of adding an element selected from 15 group to the crystalline film by using the mask, and a step of performing a heating treatment and gettering the metal from a region where the element is not added to a region where the element is implanted.

According to a second aspect of the present invention, there is provided a method of making a semiconductor device including;

a step of forming a crystalline film by crystallizing an amorphous silicon film or an amorphous film including silicon by using a metal promoting to crystallize silicon, a step of selectively forming a mask on the crystalline film, a step of accumulating stress and strain in a region other than a region where the mask is formed by irradiating a pulse laser beam or an equivalent strong beam to the crystalline film, a step of accelerating and implanting an element selected from 15 group to the crystalline film by using the mask to thereby impair a region implanted with the element, and a step of performing a heating treatment and gettering the metal from a region where the element is not implanted to a region where the element is implanted.

An amorphous silicon film is generally used as an amorphous film. However, a compound of silicon and other element, for example, a compound semiconductor designated-by $Si_x Ge_{1-x}$ (0<x<1) can be used. Further, a film added with impurities can be used for controlling film quality or for controlling the electric properties of a device. For example, an amorphous silicon film having one conductive type or the like can be utilized.

A single or a plurality of kinds of elements selected from the group consisting of Fe, Co, Ni, Cu, Ru, Rh, Pd, Os, Ir, Pt and Au can be used as the metal element.

It is particularly preferable to use Ni (nickel) in view of reproducibility and effect.

Further, in gettering, grain boundaries in a silicon film constitute a hazard in moving the metal element. Generally in a silicon film immediately after solid phase growth, metal elements are precipitated as silicides at grain boundaries and as a result, the grain boundaries grow, however, such silicides are thermodynamically stable (in the first place, metal elements are precipitated at grain boundaries since the precipitation is thermodynamically stable) and the metal elements are difficult to move from these portions. Furthermore, metal elements moved from other portions are caught and fixed thereby.

In contrast thereto, when laser annealing treatment is performed by irradiating pulse laser beam to a silicon film which has been crystallized by solid phase growth, remaining amorphous components are crystallized and further, the tendency of precipitating the metal elements at grain boundaries is significantly reduced.

The tendency of precipitating the metal elements is reduced because the thermodynamic state is accompanied by an abrupt change when a pulse laser (particularly having a pulse width of 1 μsec or lower) is irradiated and growth of crystal grains and formation of grain boundaries are not progressed sufficiently. (On the other hand, crystallization is progressed in respect of remaining amorphous components.)

The state of being irradiated with a pulse laser beam may be regarded as the state where stress and strain is accumulated in the silicon film. In that state, many metal elements are present in the silicon film by being dispersed between lattices of silicon and therefore, the metal elements are very easy to move. Further, there are few large grain boundaries catching the metal elements and therefore, later gettering can be performed efficiently.

The operation and effect can significantly be obtained by light irradiation of a pulse oscillation type, preferably irradiation of a laser beam of a pulse oscillation type compared with simple light irradiation.

According to the present invention disclosed in the specification, it is preferable that the concentration of the element of 15 group which is acceleratingly implanted, is higher than the concentration of the metal element for promoting crystallization by one digit or more.

For example, the concentration is preferably as high as $5\times10^{19}$ through $2\times10^{21}$ atoms/cm$^3$.

Further, it is effective in view of a total of the film that a total amount of implanted phosphorus element is made larger than a total amount of nickel element remaining in the film, more preferably, a total amount of implanted phosphorus element is made larger than a total amount of nickel element remaining in the film by 10 times or higher.

Further, in accelerating and implanting of the element of 15 group, an element such as hydrogen, oxygen or carbon may simultaneously be implanted at a concentration of $1\times10^{19}$ through $1\times10^{21}$ atoms/cm$^3$. When these elements are present in a large amount, crystallization of the film in heating treatment for moving the metal elements can be hampered.

It is important for promoting the effect of gettering to form unpaired bonds at high density in a region where phosphorus is implanted and for that purpose, the above-described device of hampering crystallization becomes useful.

According to the present invention, gettering is carried out in a step of forming to partition an activation layer of a transistor by etching a silicon film. Although a portion of the region where the element of 15 group is implanted may totally be removed, the portion may be used as a portion or a total of a source or a drain of a transistor. When the region is used as a portion or a total of a source or a drain of a P-channel type transistor, a P type region may be formed by implanting a P type or an N type impurity exceeding an amount of implanting the element of 15 group.

BRIEF DESCRIPTION OF THE DRAWINGS

FIGS. 2A, 2B, 2C, 2D, 2E, 2F and 2G are views showing steps of Embodiment 2;

DETAILED DESCRIPTION OF THE PREFERRED EMBODIMENT

[Embodiment 1]

In this embodiment, an example of forming a silicon film having crystalline performance on a glass substrate will be shown. An explanation will be given of steps of forming to partition an activation layer by introducing a metal element (nickel is used in this embodiment) and gettering the metal element after crystallization in reference to FIGS. 1A, 1B, 1C, 1D, 1E and 1F.

According to the steps shown by the embodiment, nickel element is introduced over an entire face of an amorphous silicon film and crystals are grown uniformly and summerizingly over the entire face.

Firstly, an amorphous silicon film 12 is formed by a plasma CVD (Chemical Vapor Deposition) process or an LP (Low Pressure) CVD process on a glass substrate 11 where a silicon oxide film (not illustrated) having a thickness of 1000 through 5000 Å, for example, 2000 Å is formed by a sputtering process or a plasma CVD process.

As an example of the glass substrate, a substrate of Corning 1737 having the strain point of 667° C. is used.

In this embodiment, the amorphous silicon film 12 is formed with a thickness of 500 Å by a plasma CVD process. Further, a treatment using hydrofluoric acid is performed to remove stain and a natural oxide film.

Next, an ultra thin film of nickel is formed. In this embodiment, a method using a spin coating process is adopted. Detailed conditions are shown in Embodiment 1 of Japanese Unexamined Patent Publication No. JP-A-7-130652.

Figure 1A:
FIGS. 1A, 1B, 1C, 1D, 1E and 1F are views showing steps of Embodiment 1.

That is, a silicon oxide film (not illustrated) having a thickness of 10 through 50 Å is provided by irradiating an ultraviolet ray (low pressure mercury lamp) in an oxygen atmosphere for 5 minutes and a solution of nickel acetate of 2 ml having a concentration of nickel of 100 ppm (in term of weight), is dripped on the substrate, the state is maintained and spin dry (2000 rpm, 60 seconds) is performed by using a spinner. In this way, an ultra thin film 13 of nickel acetate is formed. Although the thin film of nickel acetate is extremely thin and the film may not be a continuous one, no problem is resulted. (FIG. 1A).

Figure 1B:
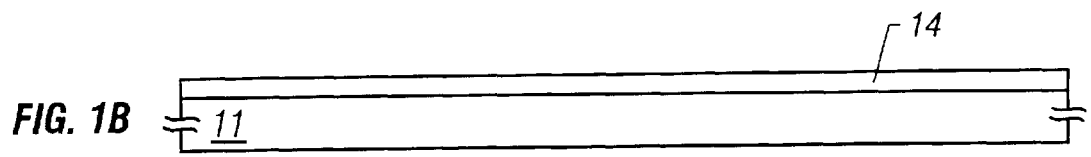

Thereafter, the operation proceeds to solid phase growth (crystallization). That is, the substrate is heated at a temperature of 550 through 700° C., for example, 600° C. in a nitrogen atmosphere and is left in this state. Nickel acetate is thermally decomposed at around 300° C. into nickel which functions as a metal at 450° C. or higher and crystallization of the amorphous silicon film is progressed. A crystallized silicon film 14 can be provided by leaving the substrate for a necessary period of time, for example, 4 hours. (FIG. 1B).

Next, laser annealing is performed by irradiating KrF excimer laser of a pulse oscillation type (wave length; 248 nm). According to the step, a state where nickel element is dispersed is obtained.

As kinds of excimer laser, ArF excimer laser, XeCl excimer laser, $CO_2$ laser, YAG laser and the like can be used. It is particularly preferable to use an excimer laser with a short wave length and a short pulse interval.

Further, although irradiation of a strong beam by using a halogen lamp, a mercury lamp or the like may be substituted therefor, the beam constitutes a nonparallel state and not so much effect of making nickel element easy to move can be expected.

Next, the silicon oxide film on the surface which has been formed previously is removed by a treatment using hydrofluoric acid. Further, a silicon nitride film 15 (thickness; 1000 Å) is formed on the silicon film by a plasma CVD process.

Figure 1C:
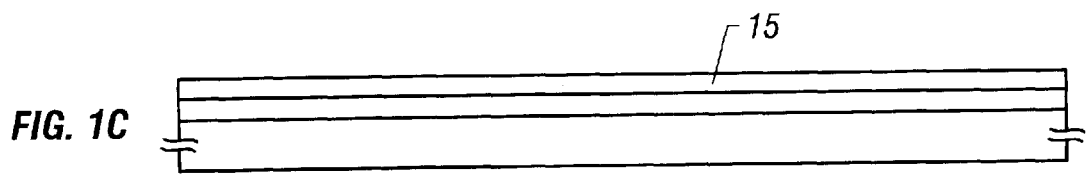

Incidentally, a silicon nitride film is easy to exfoliate since stress is very strong depending on the composition. In order to resolve the problem, the composition (particularly, concentration of hydrogen) may be changed or a silicon oxide film having a thickness of 10 through 100 Å may be formed between the silicon film 14 and the silicon nitride film 15. (FIG. 1C)

Thereafter, a mask 16 is formed by etching the silicon nitride film 15.

Next, phosphorus ions are implanted to a region that is not covered with a mask by using the mask 16. A plasma doping process is used in this step.

According to the step of doping phosphorus, the acceleration voltage is set to 5 through 25 kV and the amount of dose is set to $1 \times 10^{13}$ through $8 \times 10^{15}$ atoms/cm$^2$, for example, $5 \times 10^{14}$ atoms/cm$^2$.

Figure 1D:
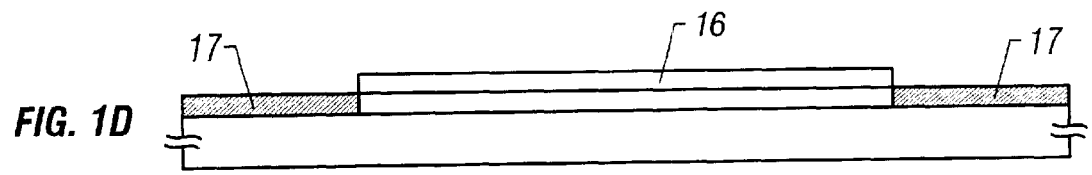

In this case, assuming that phosphorus is distributed uniformly in the silicon film, the concentration is $1 \times 10^{20}$ atoms/cm$^3$. In this way, a region 17 implanted with phosphorus is obtained. (FIG. 1D)

Conditions are set for the step of doping phosphorus such that the concentration of phosphorus is made higher than the concentration of nickel in the film by one digit or more.

According to a preliminary experiment, the concentration of nickel in the crystalline silicon film 14 in the state of FIG. 1B is about $5 \times 10^{18}$ atoms/cm$^{-3}$ on an average (density distribution is present in the thickness direction). Accordingly, in this embodiment, the condition of doping is set such that the concentration of phosphorus is about 50 times as much as the concentration of nickel.

Figure 1E:
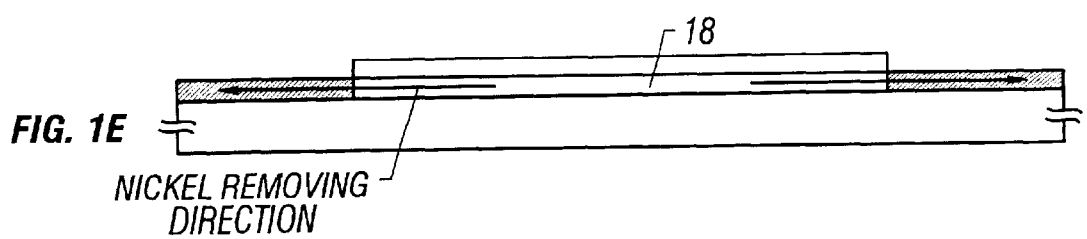

Thereafter, thermal annealing is performed at 600° C. for 2 hours in a nitrogen atmosphere by which the silicon film 14 is heated. By this step, the metal element present in a silicon film region 18 under the mask (the region is intrinsic) is moved irreversibly to the region 17 implanted with phosphorus. That is, the metal element present at the silicon film region 18 under the mask is gettered to the region 17 implanted with phosphorus. (FIG. 1E)

It is preferable that the heating temperature in the gettering step is selected from a temperature range of 500° C. through 700° C., further preferably, a temperature range of 550° C. through 650° C.

Next, the region 17 is removed by using the mask 16. Then, the mask 16 is removed and a mask smaller than the mask 16 is again arranged and a region designated by 19 is patterned.

Figure 1F:
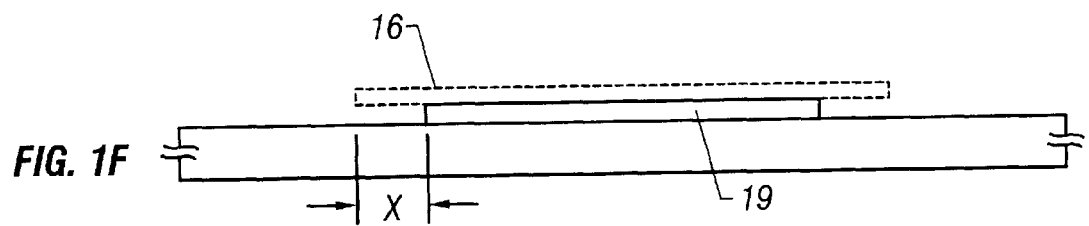

In this case, a region having a dimension designated by notation X that is a portion of the gettered region 19 is removed. The region is removed because nickel element may be adhered to an end portion of the region 18 in removing the region 17 and the concern needs to be excluded. (FIG. 1F)

In this way, an activation layer 19 of a thin film transistor is obtained. The activation layer 19 comprises a crystalline silicon film having high crystalline performance where the concentration of nickel element is reduced. Thereafter, the thin film transistor is fabricated by using the region as the activation layer.

[Embodiment 2]

This embodiment relates to a constitution in which a metal element is selectively introduced to an amorphous silicon film and the amorphous silicon film is made to perform crystal growth in a direction in parallel with a substrate from a region where the metal element is introduced to other region, which is referred to as lateral growth.

FIGS. 2A, 2B, 2C, 2D, 2E, 2F and 2G show outline of fabrication steps according to the embodiment.

Firstly, an amorphous silicon film 22 having a thickness of 500 through 1000 Å is formed by a plasma CVD process or a low pressure CVD process on a glass substrate 21 on which a silicon oxide film (not illustrated) having a thickness of 1000 through 5000 Å is formed.

Next, a silicon oxide film 23 for constituting a mask film is formed by a plasma CVD process by a thickness of 1000 Å or more, or 1200 Å in this case. In respect of the film thickness of the silicon oxide film 23, although according to an experiment conducted by the inventors and the like, it has been confirmed that no problem is posed with a film thickness of 500 Å, in this embodiment, further allowance is provided to prevent nickel from being introduced to an unintentional portion by presence of pin holes or the like. (FIG. 2A)

Further, the silicon oxide film 23 is etched into a necessary pattern by a normal photolithography patterning step whereby a window 24 for introducing nickel is formed. (FIG. 2B)

Similar to Embodiment 1, a nickel acetate ultra thin film 25 having an intended thickness is piled up by a spin coating process on the substrate where the above-described fabrication has been performed. (FIG. 2C)

As a method of introducing the metal element, other than the above-described process of using a solution, a sputtering process, a CVD process, a plasma processing (discharge processing utilizing an electrode including the metal), an ion implantation process, a gas adsorbing process or the like may be used.

Successively, by performing a heating treatment at 600° C. (nitrogen atmosphere) for 8 hours, the amorphous silicon film 22 is crystallized. At this occasion, firstly, crystallization is initiated at a portion 26 where the nickel acetate film is brought into close contact with the amorphous silicon film. Thereafter,. the crystallization is progressed to the surrounding and the crystallization is carried out also at a region 27 that is covered by the mask film 23. (FIG. 2D)

When the crystallization in the horizontal direction (crystal growth in direction in parallel to substrate) is carried out as in the embodiment as shown by FIG. 2D, three regions having different properties in gross classification are provided.

The first one is a region where the nickel film is brought into close contact with the amorphous silicon film which is the region designated by numeral 26 in FIG. 2D. The region is crystallized at an initial stage of a thermal annealing step. The region is referred to as a vertical growth region. In this region, the concentration of nickel is comparatively high, a direction of crystallization is not aligned and as a result, the crystalline performance of silicon is not so much excellent and accordingly, the etching rate in respect of hydrofluoric acid or other acid is comparatively large.

The second one is a region where crystallization in the horizontal direction is carried out which is designated by numeral 27 in FIG. 2D. The region is referred to as lateral growth region. In this region, the direction of crystallization is aligned, the concentration of nickel is comparatively low and the region is a region preferable in using in a device.

The third one is an amorphous region which the crystallization in the horizontal direction does not reach.

Next, the silicon oxide mask 23 is further etched (patterned). Then, a mask 28 is formed. In this case, when wet etching is adopted in etching the silicon oxide mask 23, the silicon film 26 at the opening 24 may be etched violently depending on an etchant.

This is because the concentration of nickel at that portion is high. Although this is preferable in view of positively excluding nickel from the silicon film, the influence may be effected on an underlying film or the substrate. When the latter does not pose a serious problem, a step of positively etching nickel (in this case, nickel is present mainly in a form of nickel silicide) may be adopted.

Next, phosphorus ions are implanted by an ion doping process to a region that is not covered by the mask by utilizing the mask 28. Phosphine ($PH_3$) diluted to 5% by hydrogen is used for the doping gas, the acceleration voltage is set to 10 kV and the amount of dose is set to $8 \times 10^{14}$ atoms/$cm^2$. Assuming that phosphorus is distributed uniformly in the silicon film, the concentration is $2 \times 10^{20}$ atoms/$cm^3$. In this way, a region 29 implanted with phosphorus is provided. (FIG. 2E)

Further, a thermal annealing treatment is carried out at 600° C. for 2 hours in a nitrogen atmosphere by which the metal element present in a silicon film region 30 below the mask is gettered to the region 29 implanted with phosphorus. (FIG. 2F)

Next, the mask 28 is removed and a portion of the silicon film 27 (including the region 29 implanted with phosphorus) is etched by which an activation layer 31 of the transistor is formed. (FIG. 2G)

By the above-described steps, the activation layer 31 which is crystallized and in which the concentration of nickel is lowered is provided.

Incidentally, in forming to partition the activation layer, a portion of the region implanted with phosphorus may be left and the region may be used for TFT.

Such an example will be explained in reference to FIGS. 3A, 3B, 3C, 3D and 3E. According to the example, by using a portion of the region 29 implanted with phosphorus that is provided for gettering, a source and a drain are constituted and thereafter, a low concentration drain region is formed by a self adjusting doping process with a gate electrode as a mask. In this way, a step of doping a high concentration N-type region needs not to be prepared separately.

Figure 3A:
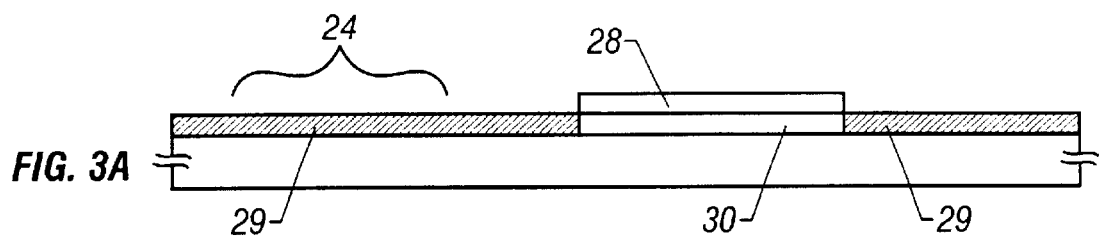
FIGS. 3A, 3B, 3C, 3D and 3E are views showing steps of fabricating TFT in Embodiment 2.

A detailed explanation will be given of the above-described fabrication steps as follows. Firstly, the processing is performed to a state shown by FIG. 2F by the steps described in reference to FIGS. 2A, 2B, 2C, 2D, 2E and 2F. The state is shown by FIG. 3A and the same numerals designate the same portions in FIG. 2F. That is, the region implanted with phosphorus is designated by numeral 29, the mask for implanting phosphorus is designated by numeral 28 and a crystalline silicon film thereunder is designated by numeral 30 and the gettering processing of the metal element by the thermal annealing treatment has already been finished. Further, the portion 24 where nickel is selectively introduced is present in a portion of the region implanted with phosphorus. (FIG. 3A)

Figure 3B:
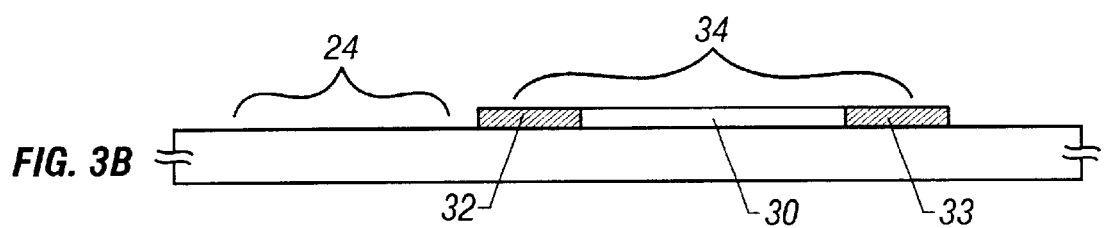

Next, by using the mask 28, an activation layer 34 is obtained. In that case, portions of the region implanted with phosphorus are left and a source 32 and a drain 33 of TFT are constituted by the portions. That is, the activation layer 34 is constituted by the source 32, the drain 33 and the intrinsic region 30 interposed therebetween. However, the portion 24 where nickel has been introduced must not be used as the source and the drain since the chemical property of the silicon film is unstable. (FIG. 3B)

Figure 3C:
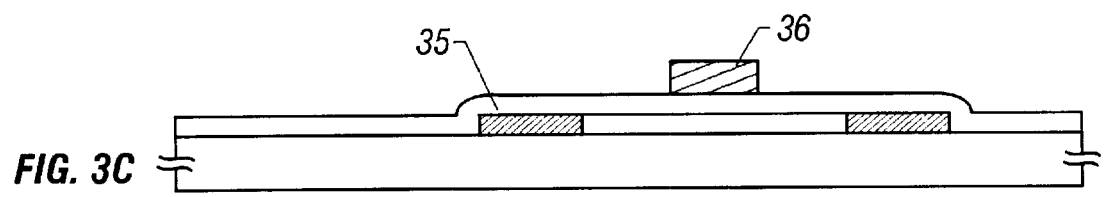

Thereafter, a silicon oxide film 35 having a thickness of 200 through 1500 Å, or 1000 Å in this case, is piled up by a plasma CVD process. The silicon oxide film functions as a gate insulating film. Next, a polycrystal silicon film doped with phosphorus having a thickness of 2000 Å through 1 $\mu$m is formed by a low pressure CVD process and the film is patterned by which a gate electrode 36 is formed. (FIG. 3C)

Incidentally, the gate electrode may be constituted by using various silicide materials or aluminum.

Figure 3D:
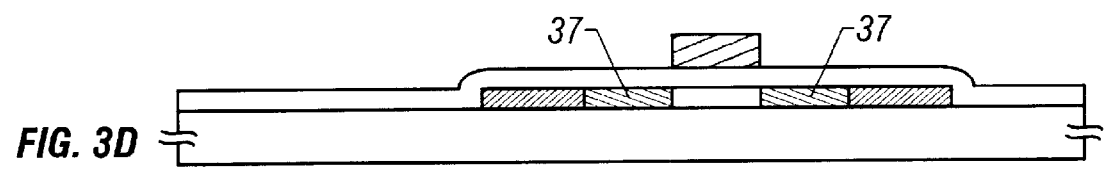

Thereafter, an impurity (phosphorus) is implanted self-adjustingly with the gate electrode 36 as a mask into the land silicon film of TFT by an ion doping process. Phosphine ($PH_3$) is used as the doping gas. The acceleration voltage is set to 50 through 80 kV since doping must be performed through the gate insulating film. Further, the amount of dose is set to $1 \times 10^{13}$ through $4 \times 10^{14}$ atoms/$cm^2$, for example, $5 \times 10^{13}$ atoms/$cm^2$. Thereby, low concentration N-type regions 37 are formed. The concentration of phosphorus of those regions is predicted to be $1 \times 10^{19}$ atoms/$cm^3$. (FIG. 3D)

Thereafter, a silicon, oxide film having a thickness of 3000 through 8000 Å is formed as an interlayer insulating film 38 over the entire face by a plasma CVD process using TEOS (tetra ethoxy silane) and oxygen, or a low pressure CVD process or a normal pressure CVD process using TEOS and ozone. The substrate temperature is set to 250 through 450° C., for example, 350° C. The silicon oxide film may be mechanically polished or may be flattened by etch back system after film formation to provide the flatness of surface.

Figure 3E:
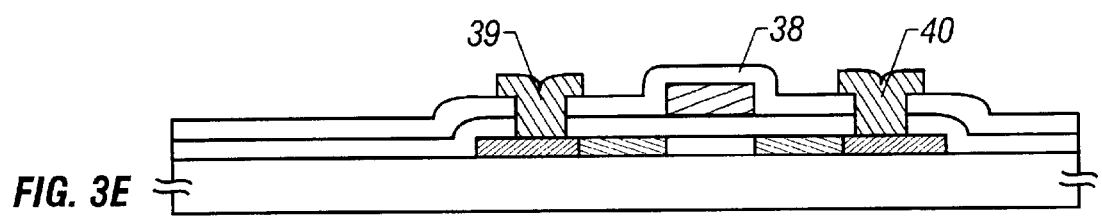

Further, contact holes are formed at the source and the drain of TFT by etching the interlayer insulating film 38 by which the aluminum wiring/electrodes 39 and 40 are formed. Finally, the assemblage is annealed at 300 through 400° C. for 0.1 through 2 hours in hydrogen by which hydrogenation of silicon is finished. In this way, TFT is finished. (FIG. 3E)

[Embodiment 3]

According to the embodiment, an example of improving the fabrication steps of Embodiment 1 will be shown. According to the embodiment, laser annealing is performed after providing the mask 16 for implanting phosphorus ions. This case is more disadvantageous than the case of Embodiment 1 in view of the fact where nickel under the mask 16 cannot be dispersed.

[Embodiment 4]

Figure 4A:
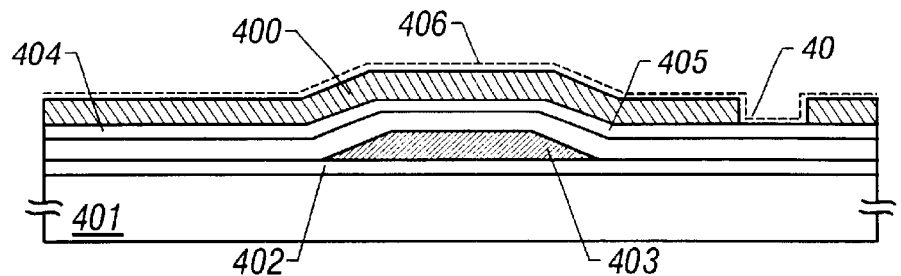
FIGS. 4A, 4B, 4C, 4D, and 4E are views showing steps of fabricating TFT of a bottom gate type.

This embodiment shows an example when a bottom gate type TFT is fabricated by using the present invention disclosed in the specification. Firstly, as shown by FIG. 4A, a silicon oxide film 402 as an underlying film is formed on a glass substrate 401.

Next, a gate electrode 403 comprising a metal silicide is formed. Further, a gate insulating film 404 is formed.

Next, an amorphous silicon film 405 is formed. Further, a mask 400 comprising a silicon oxide film is formed. An opening 40 is provided at the mask.

Next, a state where nickel element is brought into contact with and held by the surface is provided as designated by numeral 406 by using a nickel acetate solution, is produced. (FIG. 4A)

Next, the amorphous silicon film 405 is crystallized by heating. At this occasion, crystal growth is progressed in a direction designated by an arrow mark 41.

Figure 4B:
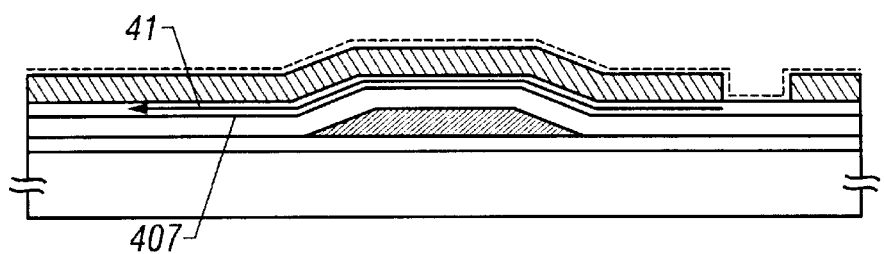

Thereby, a crystalline silicon film 407 is obtained. (FIG. 4B).

Figure 4C:
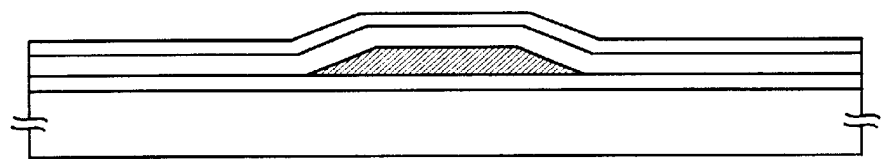

Next, a laser beam is irradiated. (FIG. 4C)

Figure 4D:
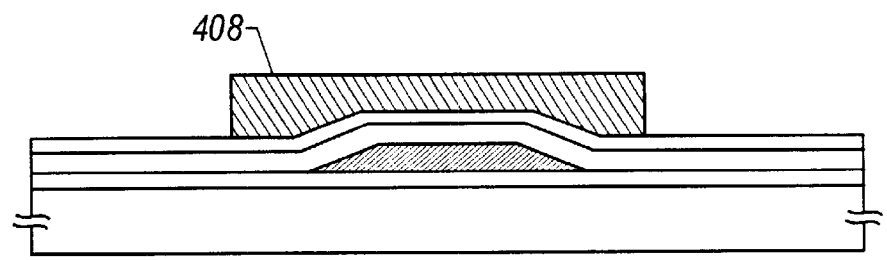

Next, a mask 408 comprising a silicon oxide film is formed. (FIG. 4D)

Figure 4E:
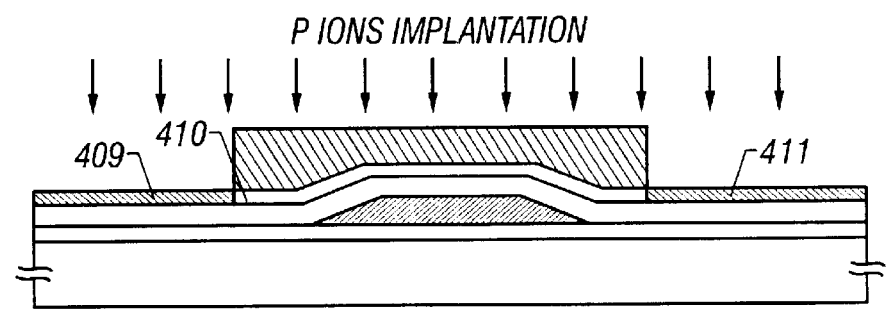

Next, heavy doping of P (phosphorus) element is carried out. In this step, heavy doping of P element is carried out at regions 409 and 411. Further, doping is not carried out at a region 410. (FIG. 4E)

Figure 5A:
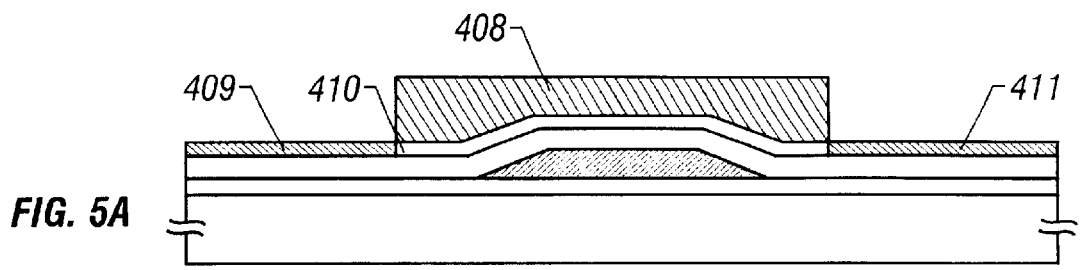
FIGS. 5A, 5B, 5C, 5D and 5E are views showing steps of fabricating TFT of a bottom gate type.

Next, a heating treatment is carried out in an atmosphere of a mixture of HCl, oxygen and nitrogen by which nickel element is gettered as shown by FIG. 5A.

Figure 5B:
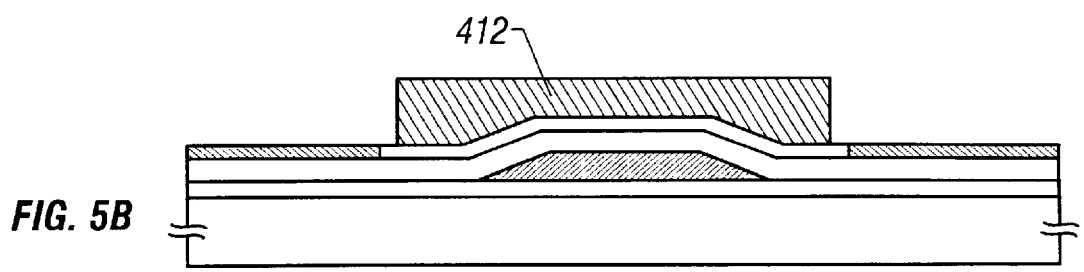

Thereafter, the mask 408 comprising the silicon oxide film is removed and a resist mask 412 is newly formed. (FIG. 5B)

Figure 5C:
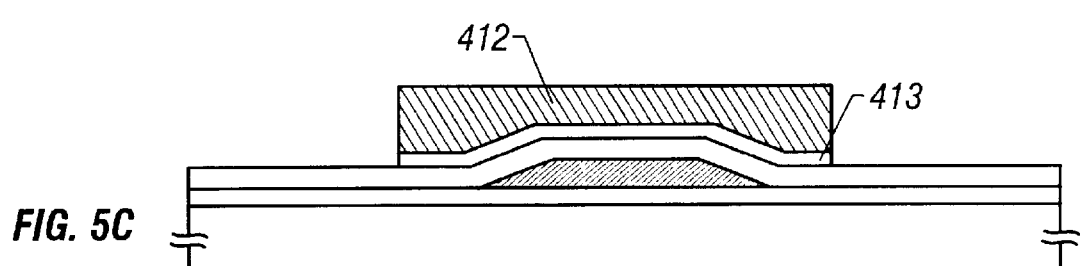

The silicon film is patterned by using the resist mask 412. In this way, a pattern of the silicon film designated by numeral 413 is left. (FIG. 5C)

Figure 5D:
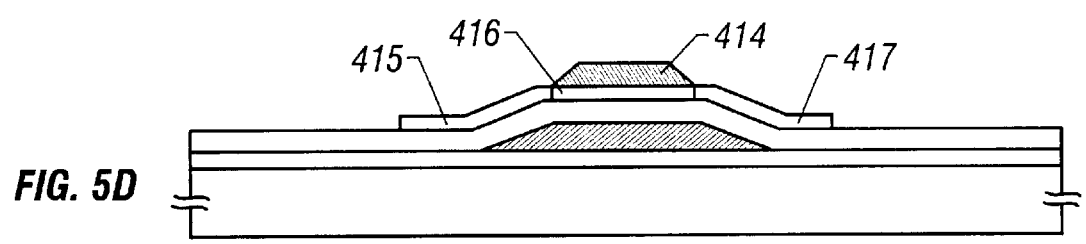

Next, a channel protective film 414 is provided and doping of impurities providing one conductive type is carried out with the channel protective film as a mask. Thereby, a source region 415 and a drain region 417 are formed. (FIG. 5D)

Further, laser beam is irradiated and the source and the drain regions are activated.

Next, a silicon nitride film 418 and a polyimide resin film 419 are formed as interlayer insulating films.

Figure 5E:
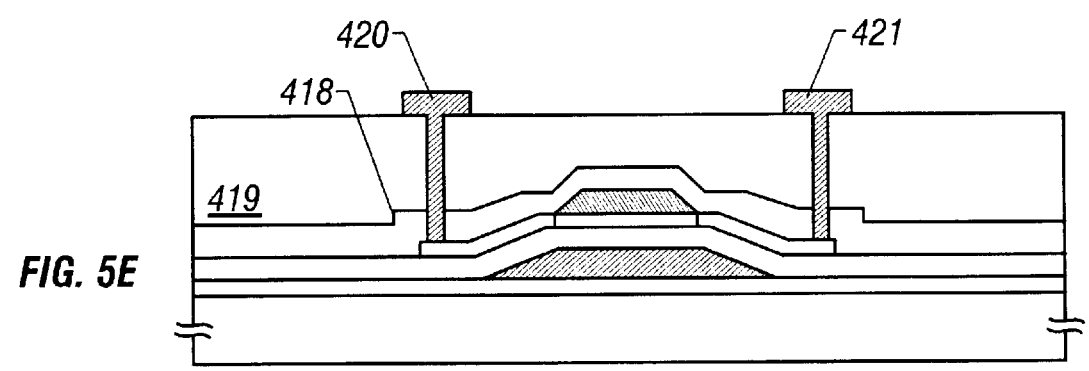

Further, contact holes are formed and a source electrode 420 and a drain electrode 421 are formed. In this way, as shown by FIG. 5E, a thin film transistor of a reverse stagger type is finished.

[Embodiment 5]

In this embodiment, outlines of devices using the invention disclosed in the specification will be shown. FIGS. 6A, 6B, 6C, 6D, 6E and 6F show outlines of respective devices.

Figure 6A:
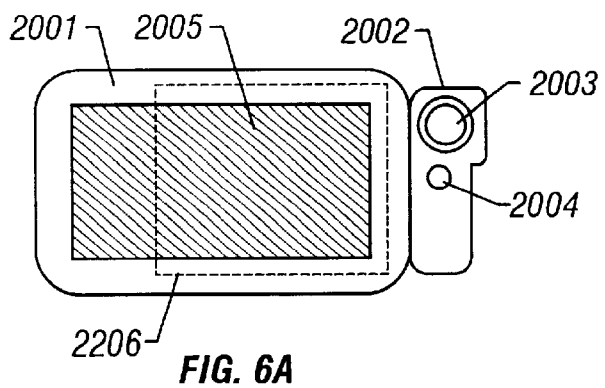
FIGS. 6A, 6B, 6C, 6D, 6E and 6F are views showing outlines of devices fabricated by using the present invention.

FIG. 6A shows a portable type terminal of information processing which is provided with communication function utilizing a telephone network.

This electronic device is provided with an integrated circuit 2006 using thin film transistors at inside of a main body 2001. Further, an active matrix type liquid crystal display 2005, a camera unit 2002 for taking images and an operation switch 2004 are installed.

Figure 12:
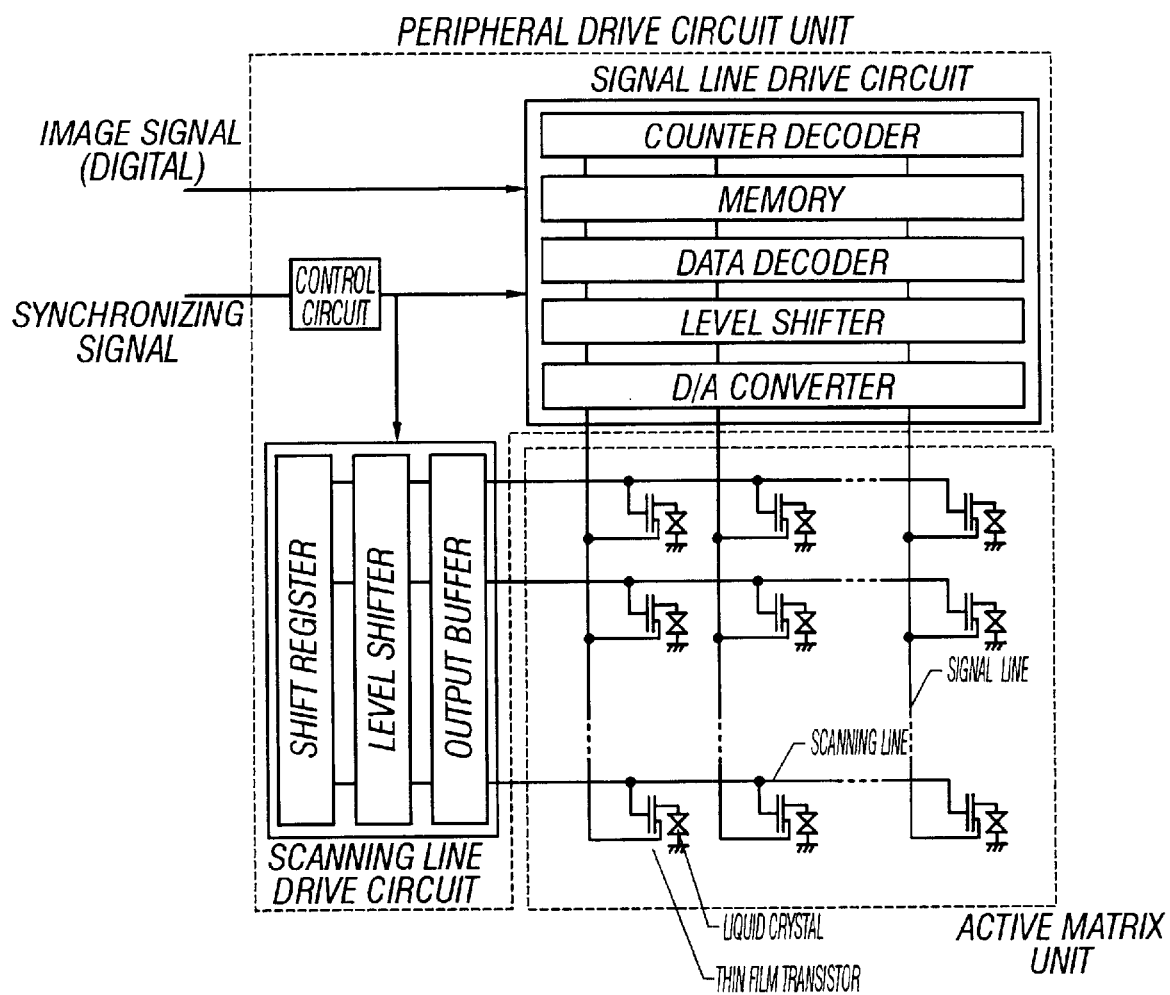
FIG. 12 is a view showing an outline constitution of a liquid crystal display device.

FIG. 12 shows an outline of the constitution of the liquid crystal display. Respective circuit blocks shown by FIG. 12 are constituted by, for example, combinations of CMOS (Complementary Metal Oxide Semiconductor) circuits comprising thin film transistors.

Figure 6B:
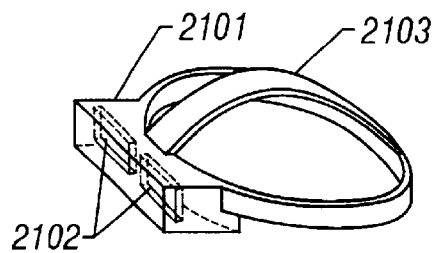

FIG. 6B shows an electronic device referred to as a head mount display. The device has a function of virtually displaying images in front of the eyes by mounting a main body 2101 on the head by a band 2103. The images are formed by a liquid crystal display device 2102 in correspondence with the left and right eyes.

According to such an electronic device, circuits using thin film transistors are utilized to downsize the device and to reduce the weight.

Figure 6C:
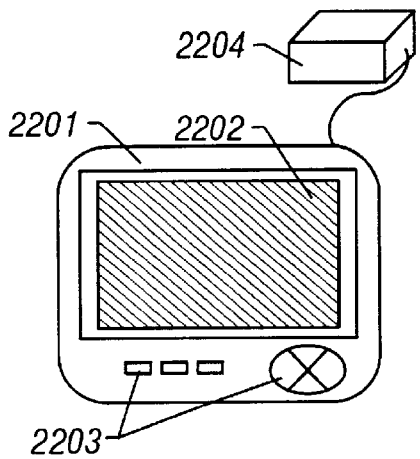

FIG. 6C is provided with a function of displaying map information or various information based on signals from an artificial satellite. Information from a satellite caught by an antenna 2204 is processed by an electronic circuit installed at inside of a main body 2201 and necessary information is displayed at a liquid crystal display device 2202.

The device is operated by operation switches 2203. Even in such a device, a circuit using thin film transistors are utilized to downsize the total constitution.

Figure 6D:
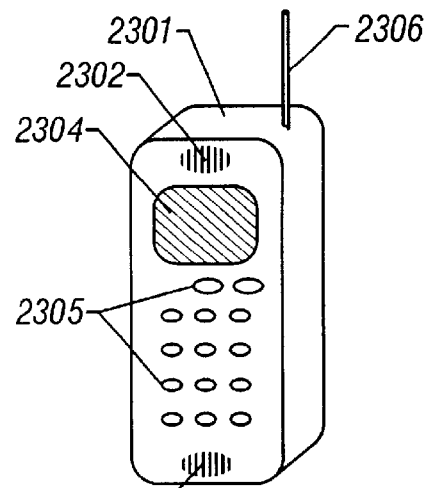

FIG. 6D shows a portable telephone. The electronic device is provided with a main body 2301, an antenna 2306, a voice output unit 2302, a liquid crystal display device 2304 and operation switches 2305 and a voice input unit 2303.

Figure 6E:
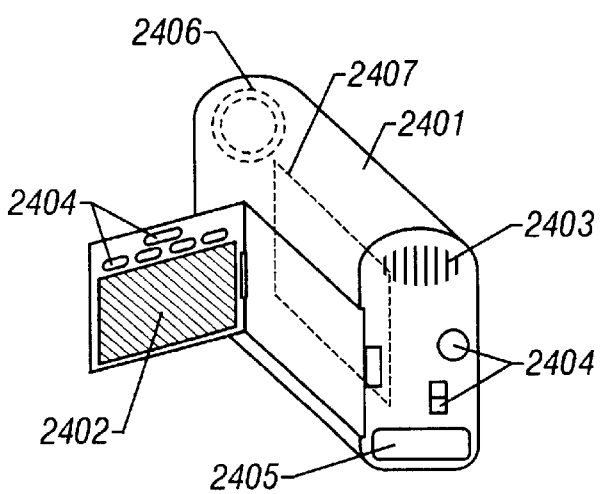

FIG. 6E shows an electronic device that is a portable type image taking device referred to as a video camera. The electronic device is provided with a main body 2401, a liquid crystal display 2402 attached to an opening and closing member and operation switches 2404 attached to an opening and closing member.

Further, the main body 2401 is installed with an image receiving unit 2406, an integrated circuit 2407, a voice input unit 2403, operation switches 2404 and a battery 2405.

Figure 6F:
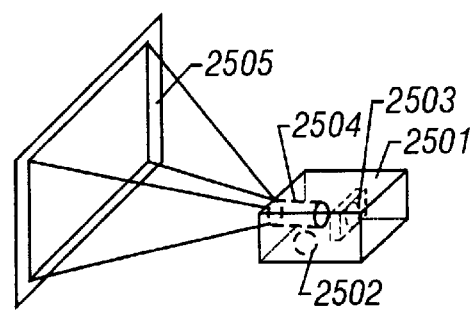
Figure 7A:
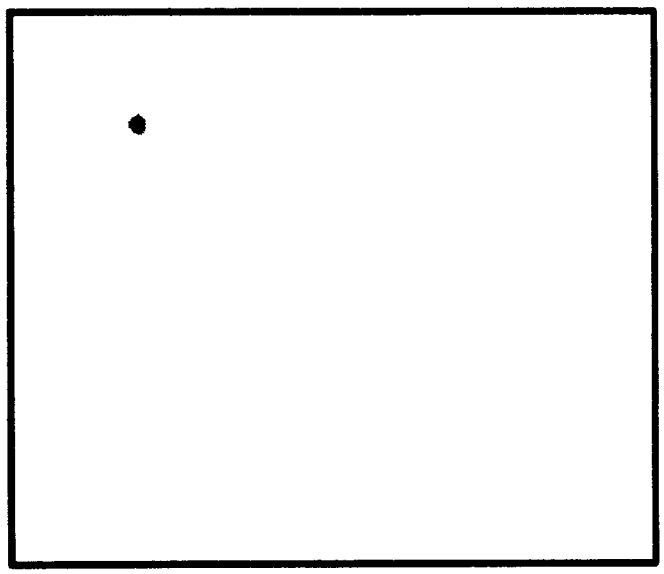
FIG. 7A is a photograph showing silicon thin film where nickel element is gettered.
Figure 7B:
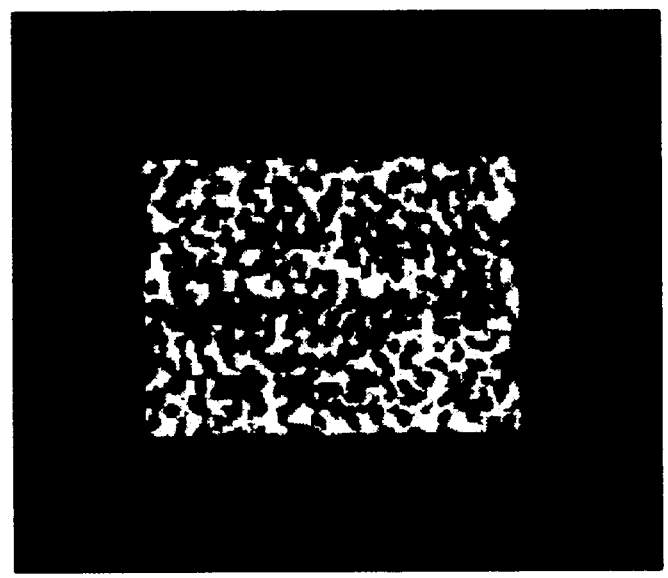
FIG. 7B is a photograph showing silicon thin film where nickel element is not gettered.

FIG. 6F shows an electronic device that is a projection type liquid crystal display device. The device is provided with a light source 2502, a liquid crystal display device 2503 and an optical system 2504 at a main body 2501 and has a function of projecting an image on a screen 2505.

Further, either of a transmission type device or a reflection type device may be used on each of the liquid crystal display devices in the electronic devices shown above. The transmission type device is advantageous in view of display characteristic and the reflection type device is advantageous when low power consumption or small size and light weight formation is sought.

Further, as a display device, flat panel displays of an active matrix type EL (Electroluminescence) display, a plasma display and the like may be used.

[Embodiment 6]

This embodiment shows a basic circuit element used in constituting the various devices shown by FIGS. 6A, 6B, 6C, 6D, 6E and 6F.

The embodiment shows a constitution where a P-channel type TFT (PTFT) and an N-channel type TFT (NTFT) are integrated on a same substrate.

A general circuit is constituted as a basic element by a CMOS circuit where a PTFT and an NTFT are constituted complementarily.

In this embodiment, an example of the case of using a technology of introducing nickel element over an entire face and crystallizing the entire face.

Figure 8A:
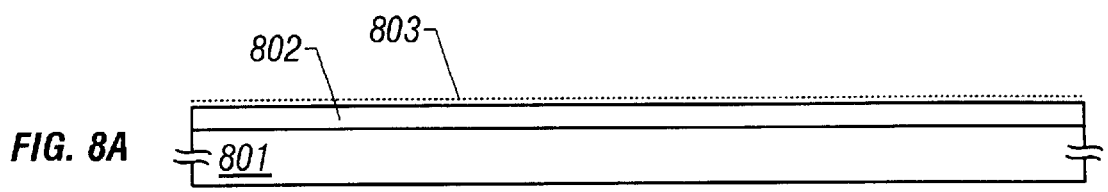
FIGS. 8A, 8B, 8C, 8D, 8E and 8F are views showing steps of forming a P-channel type TFT and an N-channel type TFT on a same substrate.

FIGS. 8A, 8B, 8C, 8D, 8E and 8F show fabrication steps. First, an amorphous silicon film 802 is formed on a glass substrate 801. Next, nickel element is brought into contact with and held by the surface of the amorphous silicon film 802 as designated by numeral 803 by using a solution. (FIG. 8A)

Figure 8B:
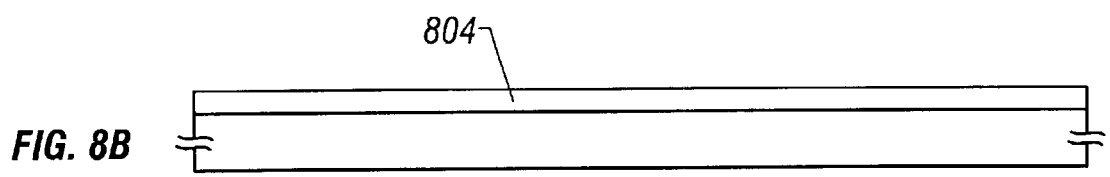

Next, a crystalline silicon film 804 is provided by performing a heating operation for crystallizing the film. (FIG. 8B)

Figure 8C:
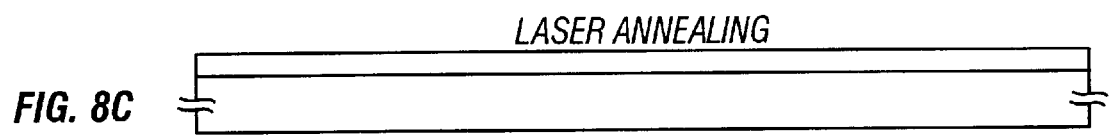

Next, nickel element remaining in the film is dispersed by performing laser annealing. (FIG. 8C)

Figure 8D:
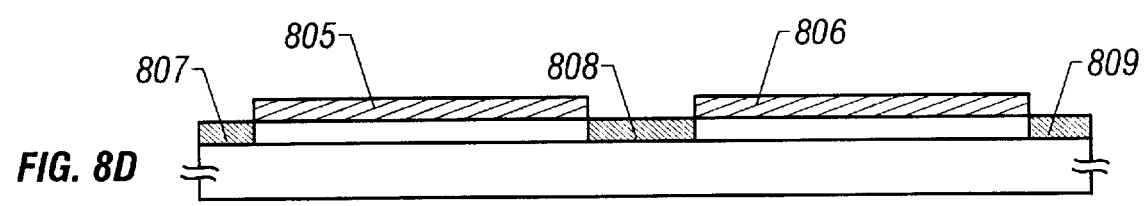

Further, masks 805 and 806 are arranged and phosphorus ions are implanted. Thereby, phosphorus ions are doped at regions 807, 808 and 809. (FIG. 8D)

Next, nickel element is gettered to the regions 807, 808 and 809 by performing a heating treatment. (FIG. 8D)

Figure 8E:
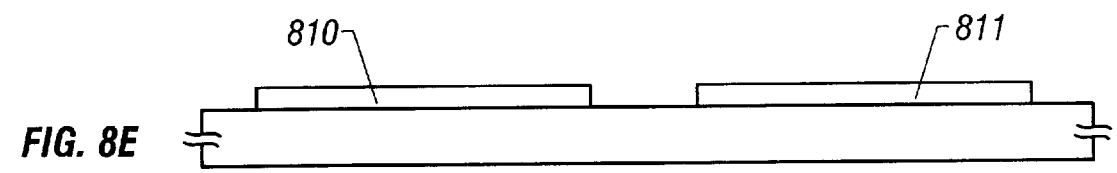

Next, the masks 805 and 806 are removed. In this way, regions 810 and 811 of a crystalline silicon film where nickel element is gettered to outside are obtained. In this case, the region 810 constitutes an activation layer of a PTFT. Further, the region 811 constitutes an activation layer of an NTFT. (FIG. 8E)

Figure 8F:
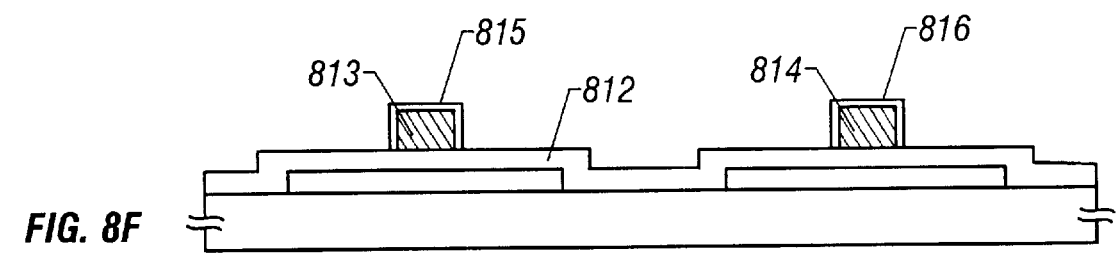

Next, a gate insulating film 812 is formed and gate electrodes 813 and 814 comprising aluminum are formed. Anodized films designated by numerals 815 and 816 are formed at surroundings of the gate electrodes. (FIG. 8F)

Figure 9A:
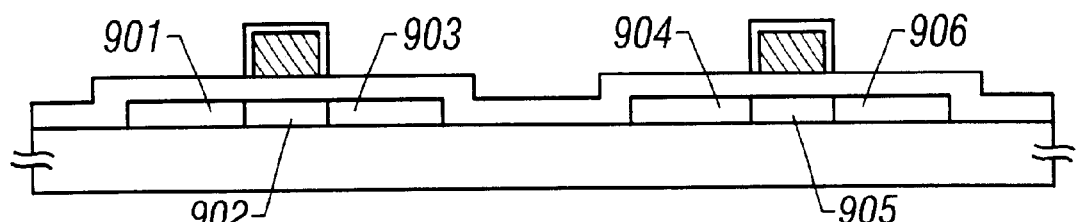
FIGS. 9A, 9B and 9C are views showing steps of forming a P-channel type TFT and an N-channel type TFT on a same substrate.

Next, phosphorus is doped at regions 901, 903, 904 and 906 by doping phosphorus by a plasma doping process. (FIG. 9A)

In this step, regions 902 and 905 where phosphorus is not doped constitute channel regions at later steps.

Next, a mask 907 is provided and boron is doped. In this step, the regions 908 and 909 are reverted from N type to P type.

Figure 9B:
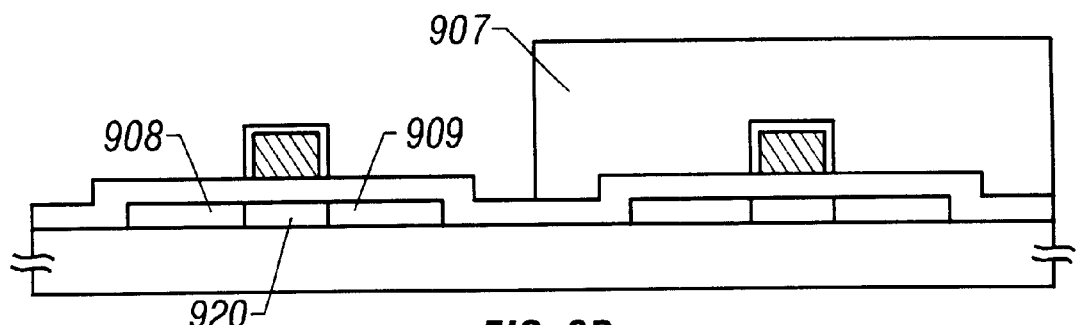

In this way, PTFT can be formed on the left side and at the same time, NTFT can be formed on the right side. (FIG. 9B)

Next, a silicon nitride film 910 is formed and a polyimide resin film 911 is formed as interlayer insulating films.

Figure 9C:
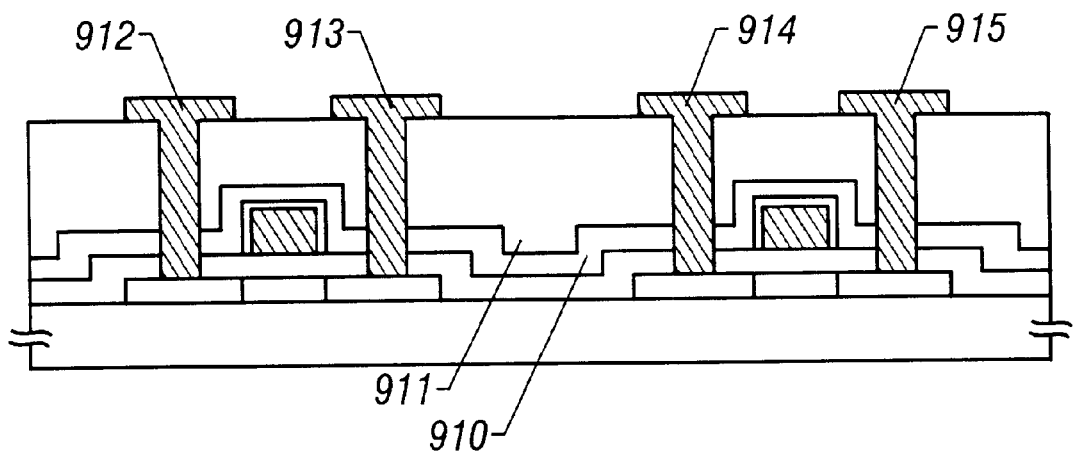

Further, contact holes are formed and a source electrode 912 and a drain electrode 913 of PTFT and a source electrode 915 and a drain electrode 914 of NTFT are formed. In this way, the constitution shown by FIG. 9C can be provided.

Here, a CMOS structure can be obtained by connecting the gate electrodes of both of TFTs and connecting the drain electrodes of both.

[Embodiment 7]

This embodiment shows an example of improving the fabrication steps shown by FIGS. 2A, 2B, 2C, 2D, 2E, 2F and 2G. FIGS. 10A, 10B, 10C, 10D, 10E and 10F show fabrication steps of the embodiment.

Figure 10A:
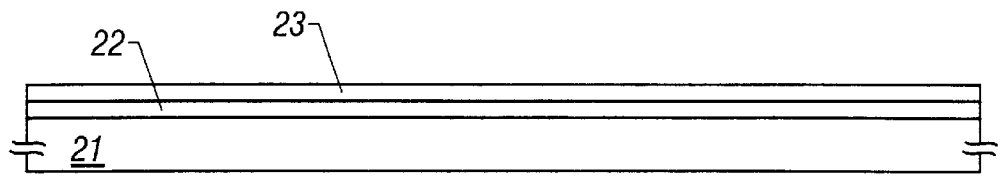
FIGS. 10A, 10B, 10C, 10D, 10E and 10F are views showing steps of Embodiment 7.
Figure 10B:
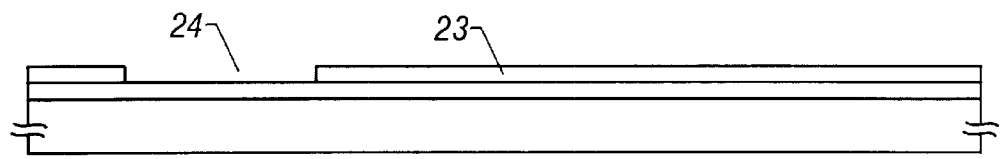
Figure 10C:
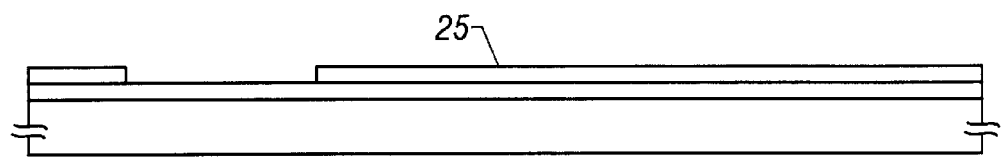
Figure 10D:
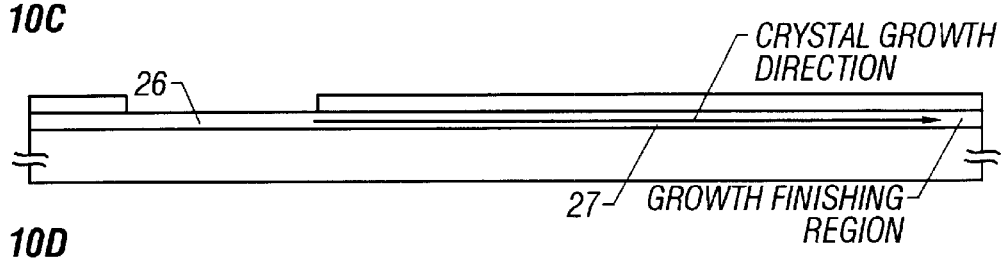

First, the steps up to the step shown by FIG. 10D are the same as those up to the step shown by FIG. 2D.

Figure 10E:
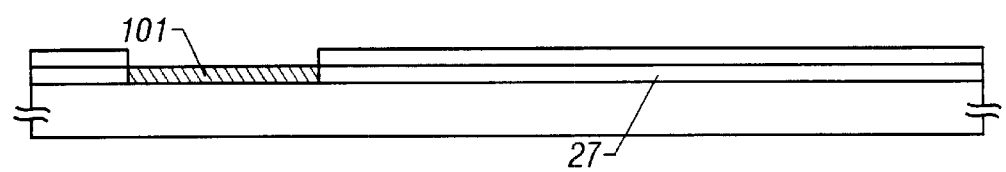

When the state shown by FIG. 10D is obtained, phosphorus ions are implanted to a region 101 under the state. That is, phosphorus ions are also implanted by using the mask that is utilized for selectively introducing nickel element. (FIG. 10E)

Figure 10F:
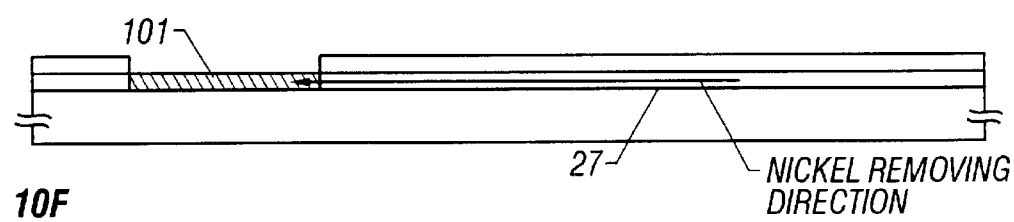
Figure 11A:
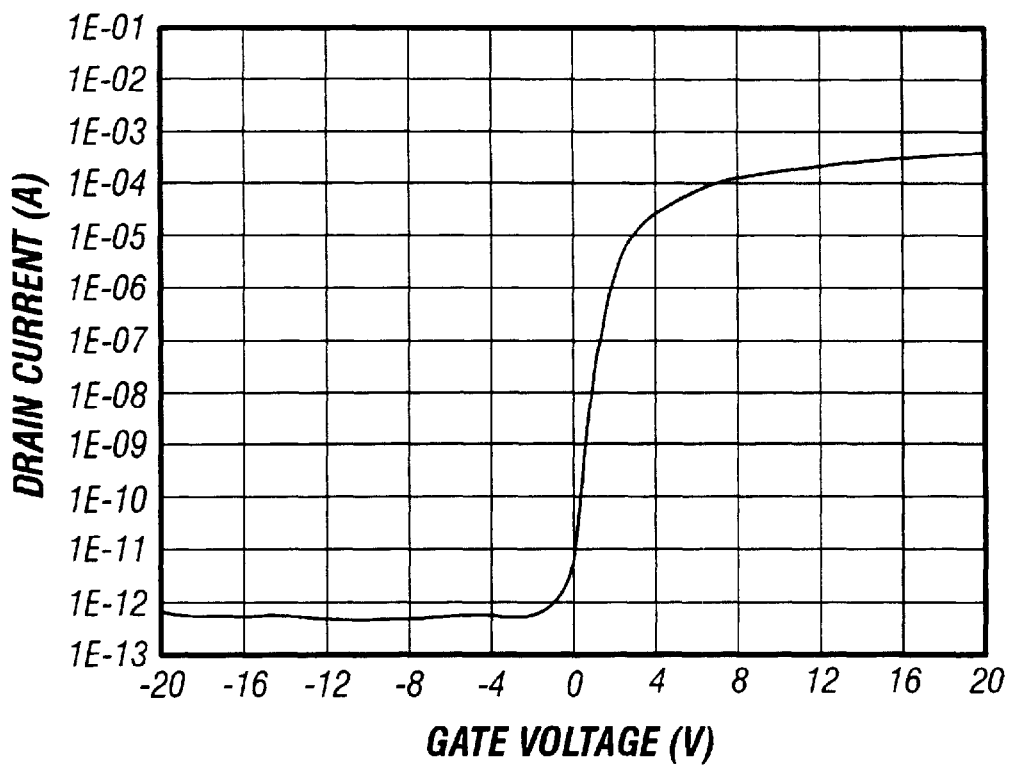
FIGS. 11A and 11B are diagrams showing a characteristic of TFT.
Figure 11B:
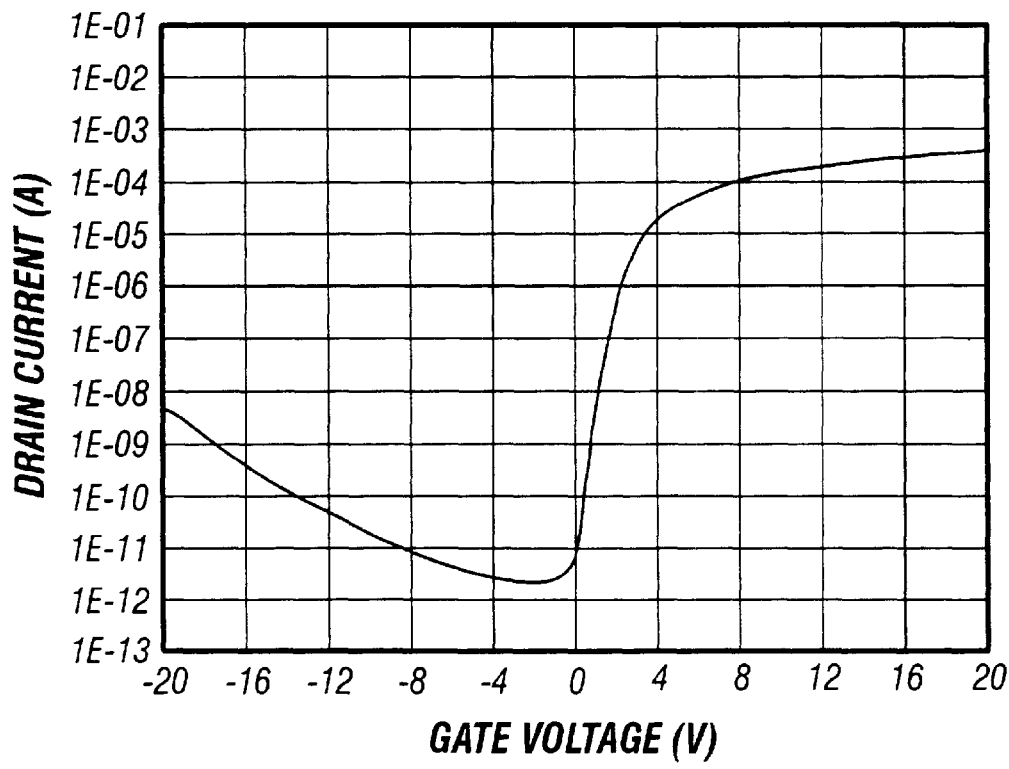

Further, nickel element is gettered to the region 101 by performing a heating treatment shown by FIG. 10F.

Thereafter, the region 101 is etched and the mask 23 is removed. Further, the crystallized region 27 is patterned into a necessary pattern.

[Embodiment 8]

This embodiment shows an example in the case where a gas phase process is utilized as a method of introducing phosphorus for gettering.

In this case, an explanation will be given of the case where nickel is utilized as a metal element for promoting crystallization and phosphorus is utilized as an element of 15 group.

According to the embodiment, a film including P is piled up on the surface of a region for gettering nickel (for example, the region 17 of FIG. 1D) by a CVD process using $PH_3$ gas.

In this case, the effect of gettering to an impaired region that is provided when phosphorus ions are acceleratingly implanted cannot be provided. However, nickel can be gettered as shown by FIG. 1E since the effect of gettering of phosphorus in respect of nickel is extremely high.

[Embodiment 9]

The embodiment shows an example in the case where a liquid phase process is utilized as a method of introducing a metal element to a region where phosphorus is introduced for gettering.

According to the embodiment, PSG (phosphorus silicate glass) is formed at the region of gettering a metal element.

For example, in the step of FIG. 1D, a PSG film is formed on the region 17 and a heating treatment is performed thereafter by which nickel element can be gettered from the region 18.

Metal element can be removed efficiently by a crystallized silicon film by using a metal element promoting crystallization of an amorphous silicon film. As a result, a large number of highly reliable electronic devices using the crystalline silicon film can be provided. As described above, the present invention is useful in industry.

What is claimed is:

1. A method of manufacturing a semiconductor device comprising the steps of:

forming a semiconductor film on an insulating surface;

forming a crystalline semiconductor film by using a crystallization promoting material;

irradiating a laser beam to said crystalline semiconductor film thereby dispersing said crystallization material therein;

introducing an impurity element to at least a region said crystalline semiconductor film;

heating said crystalline semiconductor film thereby diffusing said crystallization promoting material to said region; and removing said region.

2. A method according to claim 1, wherein said crystallization promoting material selected from the group consisting of Fe, Co, Ni, Cu, Ru, Rh, Pd, Os, Ir, Pt and Au.

3. A method according to claim 1, wherein said impurity element is 15 group element selected from the group consisting of nitrogen, phosphorous, arsenic, antimony and bismuth.

4. A method according to claim 1, wherein said laser light is selected from the group consisting of KrF excimer laser beam, ArF excimer laser beam, XeCl excimer laser beam, $Co_2$ laser beam and YAG laser beam.

5. A method according to claim 1, wherein said semiconductor device is incorporated into a display device selected from the group consisting of a liquid crystal display device, an electroluminescence display device and a plasma display device.

6. A method according to claim 5, wherein said display device is incorporated into an electronic apparatus selected from the group consisting of a portable information terminal, a head mount display, a portable telephone, a video camera and a projector.

7. A method of manufacturing a semiconductor device comprising the steps of:

forming a semiconductor film on an insulating surface;

forming a crystalline semiconductor film by using a crystallization promoting material;

irradiating a laser beam to said crystalline semiconductor film thereby dispersing said crystallization material therein;

introducing an impurity element to at least a region of said crystalline semiconductor film;

heating said crystalline semiconductor film thereby diffusing said crystallization promoting material to said region; and patterning said crystalline semiconductor film to form a semiconductor island, wherein said semiconductor island does not include said region.

8. A method according to claim 7, wherein said crystallization promoting material selected from the group consisting of Fe, Co, Ni, Cu, Ru, Rh, Pd, Os, Ir, Pt and Au.

9. A method according to claim 7, wherein said impurity element is 15 group element selected from the group consisting of nitrogen, phosphorous, arsenic, antimony and bismuth.

10. A method according to claim 7, wherein said laser light is selected from the group consisting of KrF excimer laser beam, ArF excimer laser beam, XeCl excimer laser beam, $CO_2$ laser beam and YAG laser beam.

11. A method according to claim 7, wherein said semiconductor device is incorporated into a display device selected from the group consisting of a liquid crystal display device, an electroluminescence display device and a plasma display device.

12. A method according to claim 11, wherein said display device is incorporated into an electronic apparatus selected from the group consisting of a portable information terminal, a head mount display, a portable telephone, a video camera and a projector.

13. A method of manufacturing a semiconductor device comprising the steps of:

forming a semiconductor film on an insulating surface;

forming a crystalline semiconductor film by using a crystallization promoting material;

irradiating a pulse-oscillated light to said crystalline semiconductor film thereby dispersing said crystallization material therein;

introducing an impurity element to at least a region of said crystalline semiconductor film;

heating said crystalline semiconductor film thereby diffusing said crystallization promoting material to said region; and removing said region.

14. A method according to claim 13, wherein said crystallization promoting material selected from the group consisting of Fe, Co, Ni, Cu, Ru, Rh, Pd, Os, Ir, Pt and Au.

15. A method according to claim 13, wherein said impurity element is 15 group element selected from the group consisting of nitrogen, phosphorous, arsenic, antimony and bismuth.

16. A method according to claim 13, wherein said semiconductor device is incorporated into a display device selected from the group consisting of a liquid crystal display device, an electroluminescence display device and a plasma display device.

17. A method according to claim 16, wherein said display device is incorporated into an electronic apparatus selected from the group consisting of a portable information terminal, a head mount display, a portable telephone, a video camera and a projector.

18. A method of manufacturing a semiconductor device comprising the steps of:

forming a semiconductor film on an insulating surface;

forming a crystalline semiconductor film by using a crystallization promoting material;

irradiating a pulse-oscillated light to said crystalline semiconductor film thereby dispersing said crystallization material therein;

introducing an impurity element to at least a region of said crystalline semiconductor film;

heating said crystalline semiconductor film thereby diffusing said crystallization promoting material to said region; and patterning said crystalline semiconductor film to form a semiconductor island, wherein said semiconductor island does not include said region.

19. A method according to claim 18, wherein said crystallization promoting material selected from the group consisting of Fe, Co, Ni, Cu, Ru, Rh, Pd, Os, Ir, Pt and Au.

20. A method according to claim 18, wherein said impurity element is 15 group element selected from the group consisting of nitrogen, phosphorous, arsenic, antimony and bismuth.

21. A method according to claim 18, wherein said semiconductor device is incorporated into a display device selected from the group consisting of a liquid crystal display device, an electroluminescence display device and a plasma display device.

22. A method according to claim 21, wherein said display device is incorporated into an electronic apparatus selected from the group consisting of a portable information terminal, a head mount display, a portable telephone, a video camera and a projector.

23. A method of manufacturing a semiconductor device comprising the steps of:

forming a semiconductor film on an insulating surface;

forming a crystalline semiconductor film by using a crystallization promoting material;

accumulating stress and strain in said crystalline semiconductor film thereby dispersing said crystallization material therein;

introducing an impurity element to at least a region of said crystalline semiconductor film;

heating said crystalline semiconductor film thereby diffusing said crystallization promoting material to said region; and removing said region.

24. A method according to claim 23, wherein said crystallization promoting material selected from the group consisting of Fe, Co, Ni, Cu, Ru, Rh, Pd, Os, Ir, Pt and Au.

25. A method according to claim 23, wherein said impurity element is 15 group element selected from the group consisting of nitrogen, phosphorous, arsenic, antimony and bismuth.

26. A method according to claim 23, wherein said semiconductor device is incorporated into a display device selected from the group consisting of a liquid crystal display device, an electroluminescence display device and a plasma display device.

27. A method according to claim 26, wherein said display device is incorporated into an electronic apparatus selected from the group consisting of a portable information terminal, a head mount display, a portable telephone, a video camera and a projector.

28. A method of manufacturing a semiconductor device comprising the steps of:

forming a semiconductor film on an insulating surface;

forming a crystalline semiconductor film by using a crystallization promoting material;

accumulating stress and strain in said crystalline semiconductor film thereby dispersing said crystallization material therein;

introducing an impurity element to at least a region of said crystalline semiconductor film;

heating said crystalline semiconductor film thereby diffusing said crystallization promoting material to said region; and patterning said crystalline semiconductor film to form a semiconductor island, wherein said semiconductor island does not include said region.

29. A method according to claim 28, wherein said crystallization promoting material selected from the group consisting of Fe, Co, Ni, Cu, Ru, Rh, Pd, Os, Ir, Pt and Au.

30. A method according to claim 28, wherein said impurity element is 15 group element selected from the group consisting of nitrogen, phosphorous, arsenic, antimony and bismuth.

31. A method according to claim 28, wherein said semiconductor device is incorporated into a display device selected from the group consisting of a liquid crystal display device, an electroluminescence display device and a plasma display device.

32. A method according to claim 31, wherein said display device is incorporated into an electronic apparatus selected from the group consisting of a portable information terminal, a head mount display, a portable telephone, a video camera and a projector.

33. A method of manufacturing a semiconductor device comprising the steps of:

forming a semiconductor film on an insulating surface;

forming a crystalline semiconductor film by using a crystallization promoting material;

heating said crystalline semiconductor film and an impurity element to diffuse said crystallization promoting material to a region; and removing said region.

34. A method according to claim 33, wherein said crystallization promoting material selected from the group consisting of Fe, Co, Ni, Cu, Ru, Rh, Pd, Os, Ir, Pt and Au.

35. A method according to claim 33, wherein said impurity element is 15 group element selected from the group consisting of nitrogen, phosphorous, arsenic, antimony and bismuth.

36. A method according to claim 33, wherein said impurity element is introduced by plasma doping process.

37. A method according to claim 33, wherein said semiconductor device is incorporated into a display device selected from the group consisting of a liquid crystal display device, an electro luminescence display device and a plasma display device.

38. A method according to claim 37, wherein said display device is incorporated into an electronic apparatus selected from the group consisting of a portable information terminal, a head mount display, a portable telephone, a video camera and a projector.

39. A method of manufacturing a semiconductor device comprising the steps of:

forming a semiconductor film on an insulating surface;

forming a crystalline semiconductor film by using a crystallization promoting material;

introducing an impurity element and one element of hydrogen, oxygen, and carbon, to at least a region of said crystalline semiconductor film;

heating said crystalline semiconductor film thereby diffusing said crystallization promoting material to said region; and removing said region.

40. A method according to claim 39, wherein said crystallization promoting material selected from the group consisting of Fe, Co, Ni, Cu, Ru, Rh, Pd, Os, Ir, Pt and Au.

41. A method according to claim 39, wherein said impurity element is 15 group element selected from the group consisting of nitrogen, phosphorous, arsenic, antimony and bismuth.

42. A method according to claim 39, wherein said impurity element is introduced by plasma doping process.

43. A method according to claim 39, wherein a concentration of said element is $1 \times 10^{19}$ to $1 \times 10^{21}$ atoms/cm$^3$.

44. A method according to claim 39, wherein said semiconductor device is incorporated into a display device selected from the group consisting of a liquid crystal display device, an electro luminescence display device and a plasma display device.

45. A method according to claim 44, wherein said display device is incorporated into an electronic apparatus selected from the group consisting of a portable information terminal, a head mount display, a portable telephone, a video camera and a projector.

46. A method of manufacturing a semiconductor device comprising the steps of:

forming a semiconductor film on an insulating surface;

forming a crystalline semiconductor film by using a crystallization promoting material;

introducing an impurity element one element of hydrogen, oxygen, and carbon, to at least a region of said crystalline semiconductor film;

heating said crystalline semiconductor film thereby diffusing said crystallization promoting material to said region; and patterning said crystalline semiconductor film to form a semiconductor island, wherein said semiconductor island does not include said region.

47. A method according to claim 46, wherein said crystallization promoting material selected from the group consisting of Fe, Co, Ni, Cu, Ru, Rh, Pd, Os, Ir, Pt and Au.

48. A method according to claim 46, wherein said impurity element is a 15-group element selected from a group consisting of nitrogen, phosphorous, arsenic, antimony and bismuth.

49. A method according to claim 46, wherein said impurity element is introduced by plasma doping process.

50. A method according to claim 46, wherein a concentration of said element is $1 \times 10^{19}$ to $1 \times 10^{21}$ atoms/cm$^3$.

51. A method according to claim 46, wherein said semiconductor device is incorporated into a display device selected from the group consisting of a liquid crystal display device, an electroluminescence display device and a plasma display device.

52. A method according to claim 51, wherein said display device is incorporated into an electronic apparatus selected from the group consisting of a portable information terminal, a head mount display, a portable telephone, a video camera and a projector.

* * * * *